United States Patent [19]

Sourgen et al.

[11] Patent Number: 5,099,451
[45] Date of Patent: Mar. 24, 1992

[54] MEMORY ARRAY WITH ELECTRICALLY PROGRAMMABLE MEMORY CELLS AND ELECTRICALY UNPROGRAMMABLE, UNERASABLE MEMORY CELLS, BOTH TYPES OF MEMORY CELLS HAVING FLOATING GATE TRANSISTORS

[75] Inventors: Laurent Sourgen, Aix en Provence; Gilles Lisimaque, Le Jas; Jean Devin, Aix en Provence, all of France

[73] Assignee: SGS-Thomson Microelectronics S.A., Gentilly, France

[21] Appl. No.: 272,123

[22] Filed: Nov. 16, 1988

[30] Foreign Application Priority Data

Nov. 20, 1987 [FR] France .................. 87 16063

[51] Int. Cl.⁵ .................. G11C 16/04; G11C 17/12
[52] U.S. Cl. .................. 365/185; 365/104; 365/178; 357/23.5
[58] Field of Search .......... 365/104, 184, 185, 51, 365/178, 230.03; 357/23.5

[56] References Cited

U.S. PATENT DOCUMENTS 4,618,943 10/1986 Aipperspach et al. ............ 365/184
4,758,984 7/1988 Yoshida ........................... 365/185

FOREIGN PATENT DOCUMENTS 0224206 6/1987 European Pat. Off. .
0227965 7/1987 European Pat. Off. .
0239283 9/1987 European Pat. Off. .
56-165984 12/1981 Japan .

OTHER PUBLICATIONS

Terman, "Floating Avalanche-Injection Metal Oxide Semiconductor Device With Low-Write Voltage", IBM TDB, vol. 14, No. 12, May 1972, pp. 3721-3722.

*Primary Examiner*—Glenn Gossage
*Attorney, Agent, or Firm*—Roland Plottel

[57] ABSTRACT

To avoid differentiation, in manufacture, between the random-access memory cells and read-only memory cells of the same memory array, the memory cells are all made by the same technology. These memory cells employ essentially floating gate transistors. The random-access memory cells are programmed, in a stand way, by injecting or not electronic charges in the floating gates of the transistors. The read-only memory cells are put in a programmed or an unprogrammed state by the selective implantation of impurities or not in the conduction channels of the floating gate transistors of these memory cells. There is an improved concealment of the content, which is designed to remain concealed, of these memory cells, at the same time, the conditions for making prototypes to order are improved.

3 Claims, 3 Drawing Sheets

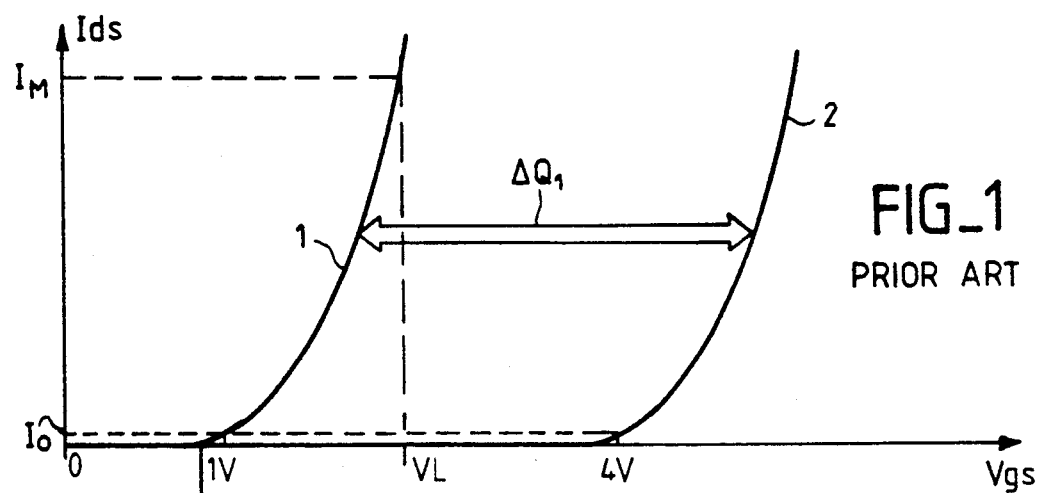
FIG_1 PRIOR ART
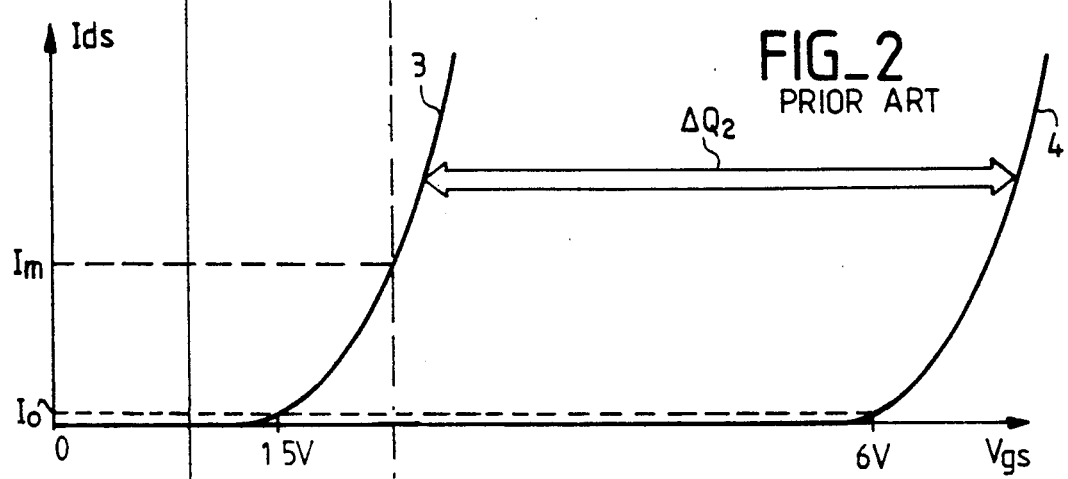
FIG_2 PRIOR ART
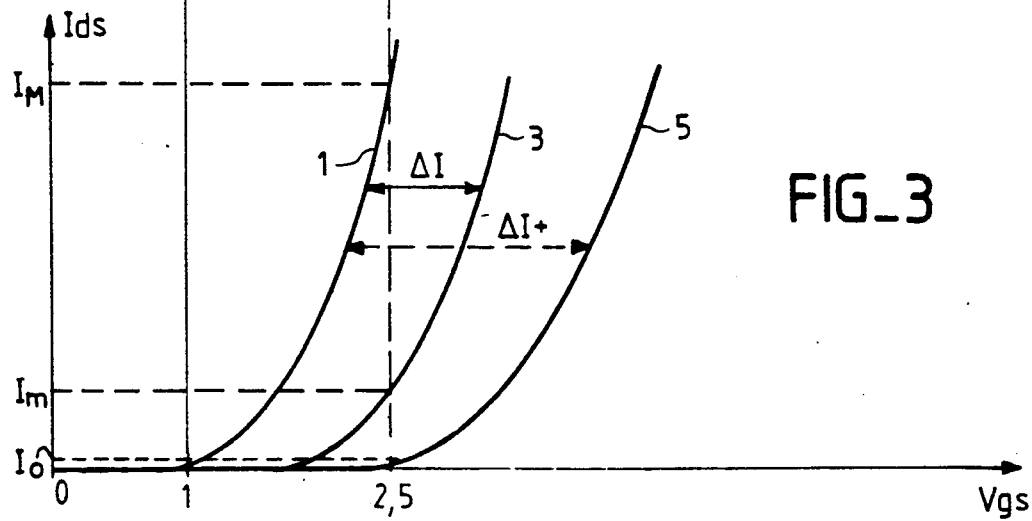
FIG_3

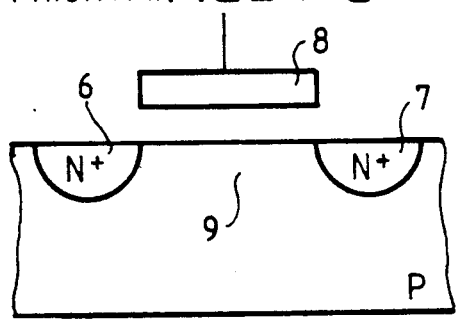
PRIOR ART FIG_4-a
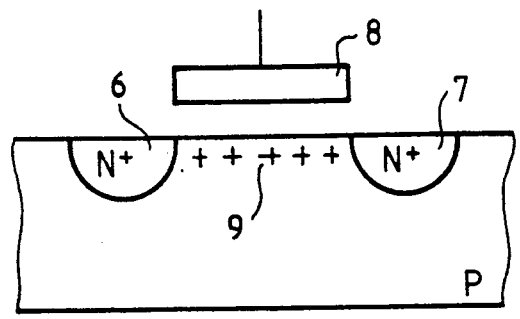
PRIOR ART FIG_4-b
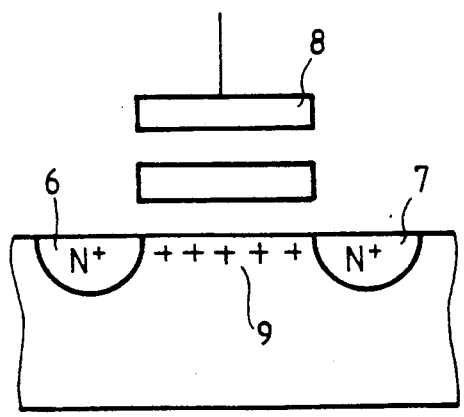
PRIOR ART FIG_5-a
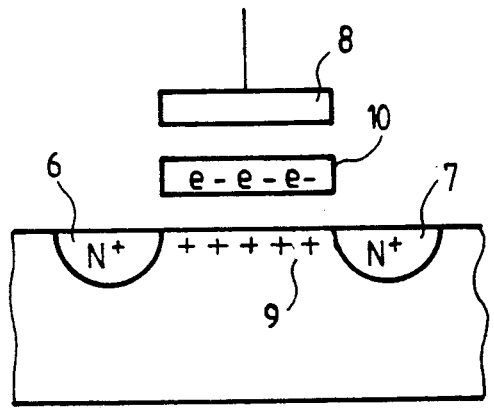
PRIOR ART FIG_5-b
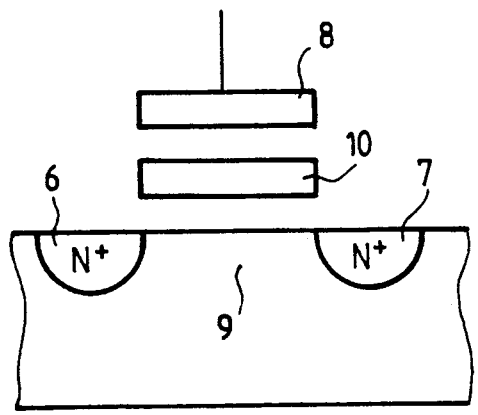
FIG_6-a
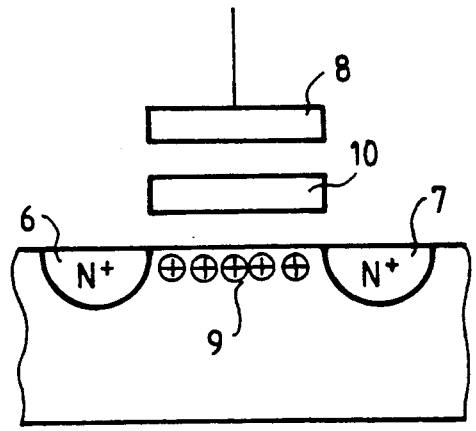
FIG_6-b

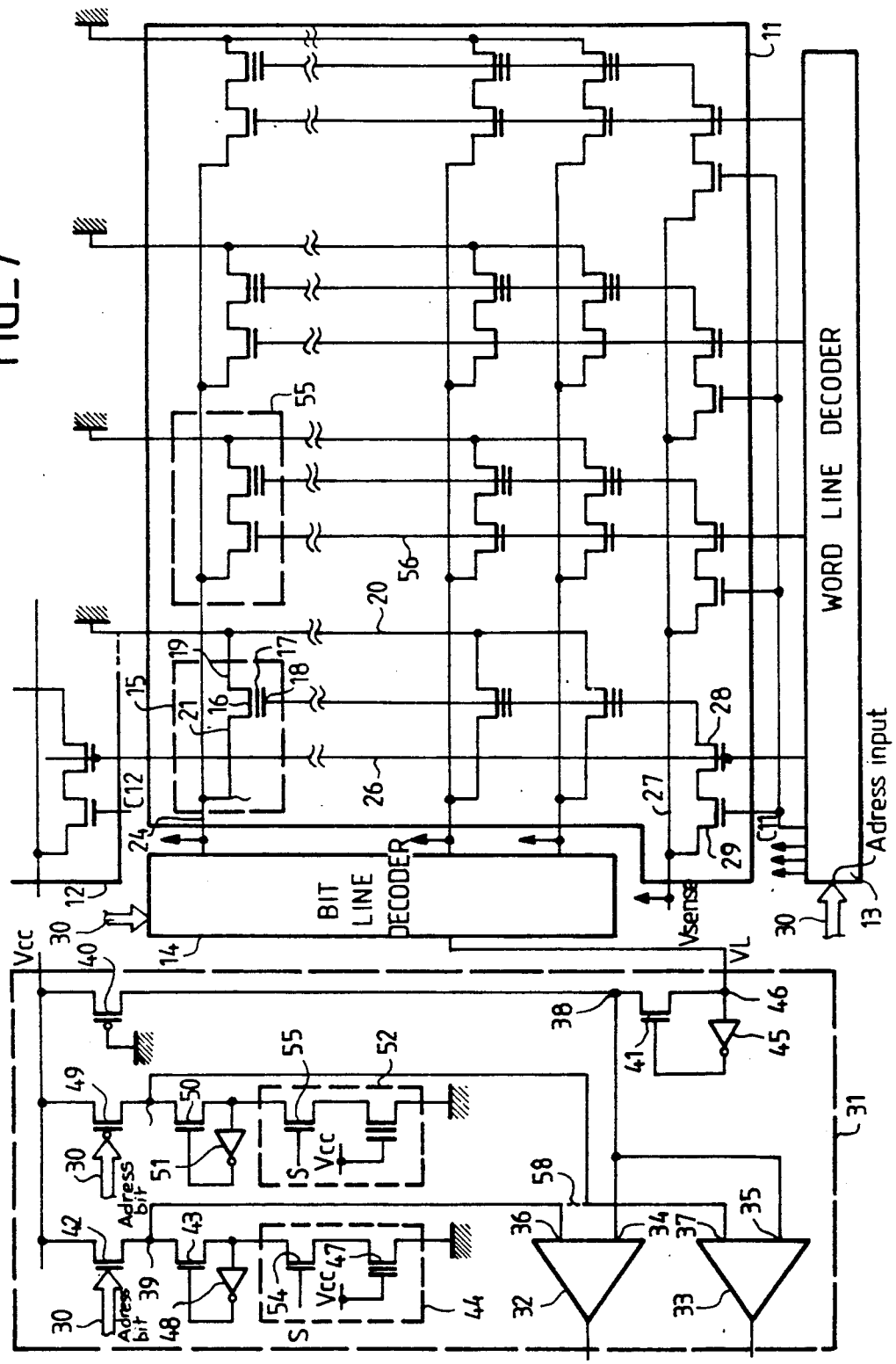

MEMORY ARRAY WITH ELECTRICALLY PROGRAMMABLE MEMORY CELLS AND ELECTRICALY UNPROGRAMMABLE, UNERASABLE MEMORY CELLS, BOTH TYPES OF MEMORY CELLS HAVING FLOATING GATE TRANSISTORS

BACKGROUND OF THE INVENTION

1. Field of the Invention

An object of the present invention is a memory as well as a method by which an electronic integrated circuit prototype including a memory of this type is designed or defined. It can be applied in memories where the memory cells have a memorizing element which is an electrically programmable (EPROM or EEPROM) floating gate transistor. It concerns memories capable of containing both random-access memory cells and read-only memory cells. Random-access memory cells are memory cells that can be programmed by a microprocessor which manages the memory according to needs expressed by a user. Read-only memory cells are not designed to be programmed by this microprocessor. They have information relating to operating instructions for the integrated circuit, the microprocessor or the memory itself. They may also contain secret codes, access keys or protecting algorithms.

2. Description of the Prior Art

One of the main problems presented by read-only memory cells lies in the decipherable nature of the information that they contain. Indeed, and this is even truer when the read-only memory cells are made in juxtaposed memory areas, using a different technology from that of memory areas with random-access memory cells, the information content of the read only memory cells can be revealed by means of a microscope. For example, in a simple technology, the content of the information programmed can be revealed by the presence or absence of a connection, the presence or absence of a fuse or the presence or absence of an electronic junction or diode. In the case of fuses, the read-only memory cells may be defined directly -by, the user, by programming. In other instances, the areas of a read-only memory should be defined at early stage in the process for manufacturing the electronic integrated circuit which contains it. However, in all cases, the presence or absence of these electronic functions makes the deciphering of the content of the read-only memory cells of the read-only memory relatively easy.

A fraudulent person who might attempt to analyze an integrated circuit of this type aimed at unveiling the content of these read-only memories, will also find his work facilitated by the fact that the technology used to manufacture the read-only memory cells is also very different from the technology for manufacturing memory cells of the random-access memory. For manufacturing reasons, and as if the aim were to make fraud more simple, the memory areas of random-access memory cells and those of read-only memory cells are geographically well separated in the memory of the circuit. So much so that the fraudulent person has no difficulty whatsover in locating these read-only memory cells. After depassivation of the electronic integrated circuit, after removing the protective layers, he may then easily gain access to the information contained.

Another problem of read-only memory cells is located in the feature wherein their size can be modulated. For although, for certain applications, a read only memory area of relatively small-sized read-only memory cells is warranted, other more demanding applications may call for a bigger memory zone. Electronic circuits manufactured in this way cannot then have any universal character. They have to be divided into categories, differentiated from one another, for example, by the size of the read-only memory areas which they might possess. This diversity of manufacture does not lend itself to high profitability, nor to high manufacturing reliability.

Another problem has been encountered in the designing of electronic integrated circuits which include memory areas: the finalizing stage of the prototype should take into account the intricate functioning of the total integrated circuit. The choices relating to the category of electronic integrated circuits, with a given number of read-only memory cells, then determine the final result. The drawback of these choices is that they have to be made at a stage well before the circuits are manufactured, even well before the prototype is made. This may lead, in the event of error, to a great deal of time being lost in making the electronic integrated circuit in question. Ultimately, these choices should guide the manufacture of the desired electronic circuits from the very outset. They condition the finalizing of the functions and manufacturing possibilities of the circuit in question. This constraint goes against the trend of developments hitherto in this field where, as in the so-called pre-diffused technique, it is sought to perform as many stages as possible for the manufacture of the electronic integrated circuits before defining it for a given application. In short, the goal to be achieved, for a memory area with a given memory size, consists in making the distinction between the portion reserved for random-access memory cells and that reserved for read-only memory cells as late as possible.

An object of the invention is to overcome these drawbacks by proposing a new memory plane where the technology for manufacturing the read-only memory cells is partly the same as that for the manufacture of random-access memory cells. The invention is based on the principle that, in a non-volatile random-access memory cell having a storage element which is a floating gate transistor, a known method employed consists in doping the conduction channel of this floating gate transistor with impurities of the same type as the substrate (enhancing) in order to promote the programming conditions of this cell. For, it is known that if the conduction channel is doped, it is doped only at the surface. When this transistor is put into saturation so that it can be programmed, then, the injection of electrons in the floating gate is all the more efficient. Quite simply, if the channel is not doped, all the channel and the electrons injected from the bottom of the channel partly lose their energy for rising to the surface of this channel, towards the gate oxide which separates them from the floating gate. Since their energy has been reduced, they are then not mobile enough to cross this gate oxide barrier. The injecting efficiency is then lower.

The fact of injecting impurities in a conduction channel in order to promote the programming operation has the effect of shifting the conduction threshold voltage of these floating gate transistors upwards. For example, the drain-source voltage at which a non-programmed floating gate transistor starts conducting is about one volt when its conduction channel is not doped but becomes about 1.5 volts when its conduction channel is doped. The consequence of this is that when the information content stored in a memory cell of this type is being read, and depending on a drain-source voltage imposed on this transistor, the current which it conducts will be smaller when this conduction channel is doped than when it is not doped.

The invention turns this phenomenon to advantage, for example by exaggerating it in order to differentiate between non-programmed read-only memory cells and programmed read-only memory cells. A distinction is then made between the current that a read-only memory cell is capable of putting through depending on whether its conduction channel is more doped or less doped depending on the programming state which is sought to be imposed on it.

This approach gives all the expected advantages. In particular, the rate of impurities implanted in a conduction channel cannot be detected by microscopic examination. Furthermore, the choice of one and the same type of cell, namely cells with floating gate transistors, to make both the read-only memory cells and the random-access memory cells makes it possible, in order to build a prototype, to define a memory which is entirely provided with random-access memory cells, with floating gate transistors, and makes it possible to set the distribution of these cells among random-access memory cells and read-only memory cells after the prototype finalizing stage. For a memory with a given capacity, it then becomes quite possible to substantially increase the size of the read-only memory cells. In all cases, the size of the overall memory area may remain identical.

Furthermore, the operation for implanting the impurities in the conduction channel of the floating gate transistors is one which takes place fairly late in the manufacturing process. Hence, numerous operations may be performed to manufacture a universal electronic integrated circuit before fitting it to specific purposes. Furthermore, the implanting operation is not specific in itself. For, given that implantation is already necessary for the memory area of the random-access cells but that this implantation is not done in the peripheral circuits of the memory area, it is already necessary to use a mask. All the photo-masking operations required by a manufacturing method for memory areas according to the invention then have the sole effect of defining this mask in a different way, possibly in a more precise way, to share out the different types of cells.

Furthermore, in an application where the rate of impurities implanted in the programmed read-only memory cells is exaggerated, another mask may be warranted as the case may be. However, this other mask is made and applied under the same conditions than the preceding one.

An object of the invention therefore, is a memory firstly, provided with electrically programmable random-access memory cells, these cells being of the type that comprise a floating gate transistor, and secondly comprising read-only memory cells, wherein the read-only memory cells are also of the type comprising a floating gate transistor but where the programming state is differentiated by the conduction performance of the conduction channel of the floating gate transistor.

Another object of the invention is a method to define an electronic integrated circuit comprising a memory array provided with random-access memory cells and read-only memory cells, said method comprising the following steps:

a prototype is made containing only random-access memory cells, the position at which the random-access memory cells are designed to become read-only memory cells in the circuit to be defined, is determined, and an integrated circuit is made the memory of which is designed in accordance with the above indicated memory array, the read-only memory cells being placed at the defined corresponding positions.

BRIEF DESCRIPTION OF THE DRAWINGS

The invention will be better understood from the following description and the appended figures which are given purely by way of indication and in no way restrict the scope of the invention. Of these figures:

FIGS. 1 to 3 show characteristic curves of conduction performances of conduction channels of floating gate transistors used in the invention;

FIGS. 4a to 6b show schematic sectional views of MOS type transistors, which may or may not be programmed and may or may not be provided with implantations of impurities the invention;

FIG. 7 shows a schematic view of a memory array with read-only memory cells and random-access memory cells, as well as a device to read the content of information in these read-only memory cells.

DESCRIPTION OF PREFERRED EMBODIMENTS

FIG. 1 shows the characteristic curves Ids versus Vgs showing current flowing in the conduction channel of a floating gate transistor as a function of the gate-source voltage applied to this transistor, while it receives a positive voltage between the drain and the source, and depending on whether it is in one programming state or another. The curve 1 shows the current response of a blank (i.e. unprogrammed) floating gate transistor. This transistor has a conduction threshold voltage of about one volt and delivers a high current IM when its drain and source are subjected to a potential difference equal to a read potential VL of about 2.5 volts for example. When this transistor is programmed, i.e. when a quantity $\Delta Q_1$ of electrons has been injected into its floating gate, the conduction threshold of this transistor gets shifted and it no longer becomes conductive, for example, unless a voltage, between gate and source, of about 4 volts is applied to it. Since this voltage is greater than the voltage effectively applied to its gate when reading, this transistor cannot conduct a high current. But conducts only a very low current Io.

FIG. 2 shows what happens to the characteristic curve of FIG. 1 when the conduction channels of floating gate transistors have been doped, whether it is in one programming state or in another. The conduction threshold of the blank transistor is slightly shifted and goes for example, to 1.5 volts and the current which this transistor can conduct when it is subjected to the same read voltage VL as earlier, is now reduced. Consequently, it is no longer equal to more than Im (curve 3). On the contrary, when the transistor has been programmed, the injection of charges has been more efficient: the number of electrons $\Delta Q_2$ injected in its floating gate is now greater than the number of electrons which might have been injected when the conduction channel was not doped. The result of this is that the conduction threshold of the doped and programmed floating gate transistor is now shifted to a far greater extent. For example, it is equal to 6 volts (curve 4). The effect of this is that the retention capacity of information in this floating gate transistor is thereby increased. In other words, retention time and the non-volatile character of the storage of information in a floating gate transistor of this type is increased.

FIG. 3, which refers to the previous two figures, shows the use of this doping in order to form the programming mode of the read-only memory cells according to the invention. This programming mode is achieved by masking the memory array when manufacturing the desired electronic integrated circuit. A distinction is made therein between the blank memory cells, for which the characteristic curve of conduction of the conduction channel of the floating gate transistor is the curve 1 of FIG. 1 and programmed read-only memory cells (without charges being injected in the floating gate) for which the characteristic curve of conduction of the conduction channel is the curve 3 of FIG. 2, or even better, by exaggerating the doping of the conduction channel, a curve 5. The shifting of the curves, depending on whether or not they have been programmed, does not correspond to an injection of electronic charges or $\Delta Q$ but to a variation $\Delta I$ of the implantation of impurities in the conduction channel.

The curve 1 shows a blank memory cell capable of delivering a current IM during reading, with a reading voltage VL while the curve 3 shows that the transistor cannot put through a current Im (of the same type as that of FIG. 2). The measurement of the difference between these currents enables the differentiation between the programming state of the cells. If the implanting of the impurities is exaggerated, the curve 3 may get shifted up to the curve 5, causing the current Im to decrease to the same extent, so that this current becomes close to Io for example. In this case, the programming state of the random-access memory cells and of the read-only memory cells can be measured with the same current sensor which has its triggering threshold located, for example, at twice Io ($2 \times$ Io) Io or at Im/2.

FIGS. 4a to 6b show schematic sectional views of floating gate transistors which can be used in random-access memory cells and floating gate transistors which can be used in read-only memory cells. FIGS. 4a and 4b show a transistor provided with drain and source regions, 6 and 7 respectively, and the gate 8. This transistor is an N channel transistor and is conductive when a positive potential is applied to its gate 8. The difference between FIG. 4a and FIG. 4b takes the form of the presence of an implantation, in the latter, of P-type impurities at the surface of the conduction channel 9 of the transistor. The effect of this is to shift the conduction threshold of this transistor towards high values. In practice, with an implantation of boron atoms with a concentration of $10^{17}$ atoms per cm$^3$, this conduction threshold is equal to about two volts.

FIG. 5a and 5b show floating gate transistors which have the conduction channel 9 doped so as to promote the programming operation. FIG. 5b gives a schematic view, through the presence of electrons e$^-$ (trapped in the floating gate 10 of this transistor) of the principle on which the programming is based. On the contrary, FIG. 6a and 6b show floating gate transistors which can be used in read-only memory cells and for which the non-programmed character (FIG. 6a) and programmed character (FIG. 6b) takes the form of the presence or absence of an implantation of impurities in the conduction channel 9. The comparisons of figures 5 and 6 shows that, in a combined memory array having read-only memory cells and random-access memory cells, the method for manufacturing transistors forming storage devices of these memory cells is the same. In all cases, they are transistors with floating gates.

Should the comparison of the currents flowing into the transistors of the read-only memory cells entail comparing a current IM with a current Im, the memory array has only two types of floating gate transistors. A first type is formed by transistors which have their conduction channel doped by impurity implantations (5a, 5b and 6b) and the other type is formed by floating gate transistor in which the conduction channel has no doping impurity (FIG. 6a). In this case, it is observed that it is almost impossible to ascertain, by external observation, that all the memory cells observed are of the read-only memory cell type or the random-access memory cell type, where the cells in question are programmed read-only memory cells.

When the implanting of the impurities in the conduction of the programmed read-only memory cells has been exaggerated, it is similarly possible to have only two types of read-only memory cells: non-programmed read-only memory cells also have the same type of concentration of impurities as blank random-access memory cells. Programmed read-only memory cells have a greater concentration of impurities in the conduction channel of their floating gate transistor. Moreover, it is observed that, in this latter case, the distinction between the programmed cells and the non-programmed cells can be done in the same way depending on whether they are random-access or read-only cells. When they are not programmed, their conduction current is equal to Im. When they are programmed, their conduction current is equal to Io.

FIG. 7 shows a memory plane provided with memory cells according to the invention. This memory has for example, memory blocks such as 11 or 12 each having the same number of memory cells to which access is made by a word line decoder 13 and a bit line decoder 14. Each memory cell, for example, the memory cell 15, has a floating gate transistor 16 provided with a floating gate 17 and a control gate 18, and connected by its source 19 to a ground connection 20 and by its drain 21 to a bit line 24. In the example shown, the memory cells are of the EPROM type. They may be of the EEPROM type in the invention. In this case, the memory cell has, between the bit line 24 and the drain 21, a control transistor which has its gate connected to a word line, for example, the word line 26. The bit lines such as 24 and the word lines such as 26 come respectively from the bit line decoder 14 and the word line decoder 13.

For each memory block, a connection 27 conveys a potential Vsense to the control gates 18 of the floating gate transistor 16 of the memory cells. This routing is organized by the series connection of two transistors, respectively an access transistor 28 and an access control transistor 29 in series with each other between the connection 27 and the control gates 18. These transistors respectively receive, at their control gate, the signal available at the word line 26 and a block command signal C. For example, the transistor 29 receives the signal C11 relating to the block 11.

When an address 30 is applied to the decoders 13 and 14, a memory cell, for example, the memory cell 15 may be read. A read circuit 31 then applies a read potential VL to the bit line 24 connected to the cell 15. If the memory cell 15 is programmed, then a substantial current flows along the bit line 24. If it is not programmed, weak current flows. The read circuit 31 has comparators to extract information on the programming state from the amount of current conducted It comprises, for example, the two comparators 32 and 33. Each of these comparators 32 and 33 (which, in practice, are voltage comparators) receives, at an input 34 and 35 respectively, a signal corresponding to the current that flows through the cell 15. At the points of access to their other inputs 36 and 37 respectively, the comparators 32 and 33 receive a reference signal relating to the fact that the memory cell 15 is a random-access memory cell or a read-only memory cell.

The potentials representing the current that flows through the cell 15 and the reference potentials relating to the currents that flow through standard memory cells 44 or 52 are set up in the same way. For example,. these potentials come each time from the mid-points, 38 or 39 respectively, of a divider bridge with transistors, comprising the transistors 40–41 and 42–43 respectively. The transistor-based divider bridge 40–41 is series connected, by means of the decoder 14 of the bit lines, with the memory cell 15 to be read, and the transistor-based divider bridge 42–43 is connected to the standard memory cell 44. Barring losses in voltage by commutation in the decoder 14, it is observed that the succession of transistors 40–41 and of the memory cell 15 is of the same type as the succession of transistors 42–43 and of the standard memory cell 44.

Each of these cascades works as follows. For example, the transistor 40 is a P channel transistor, with its gate connected to the ground: it is always conductive. Ultimately, it behaves like a resistor. The transistor 41 is an N-channel transistor. Its gate is controlled by a looping back of its source by means of an inverter 45. This looping back acts as a regulator. It can be shown that the reading voltage VL available at the source 46 of the transistor 41 falls to an extent, but slightly, when the chosen memory cell 15 is programmed: when its transistor 16 is on. This slight drop in voltage is nevertheless taken into account by the inverter 45, to be applied in feedback to the control gate of the transistor 41. The latter then becomes more conductive and injects greater current into the memory cell 15. The internal conduction resistance of this memory cell then makes the potential available at the point 46 rise again in such a way that it can be considered to be substantially constant.

Under these conditions, the potential available at the mid-point 38 results from the series-connection of the conduction resistor of the transistor 40 with the transistor 41, between two substantially constant potentials, firstly VCC and, secondly, VL. In view of the constant nature of the conduction resistance of the transistor 40 (it is always conductive), a potential is obtained at the mid-point 38, representing the current that flows through the cell 15. If the cell 15 is programmed, if the transistor 16 is on, the potential at 38 is low. If not, the potential at 38 is substantially equal to Vcc (minus the potential drop in the transistor 40).

The reference potential allowed at the input 36 of the voltage comparator 32 is prepared under the same conditions. The standard cell 44 may be a programmed cell: its floating gate transistor 47 is on. An inverter 48 can also be used to obtain regulation of the read voltage applied to this standard cell 44. Consequently, the potential available at the mid-point 39 of the transistor-based divider bridge 42–43 is obtained under the same conditions. So as to enable a useful comparison, a transistor 42 is chosen which is half as resistant (twice as big) as the transistor 40. For the same current passed through the cell to be read 15 and the standard cell 44, when both cells are programmed, the standard potential available at the input 36 of the comparator 32 is greater than the potential of the mid-point 38 available at the input 34 of this comparator 32. On the contrary, if the cell 15 is not programmed (which, ultimately, is what is to be known) the potential at the mid-point 38 is almost equal to Vcc. It is therefore greater than the standard potential available at the mid-point 39 which does not change.

If the cell 15 is a random-access memory, it can be considered that the signal available at the input 34 of the comparator 32 is equal to Im or to Io depending on whether this cell is programmed or not, while the signal available at the input 36 of the comparator 32 should be proportionate to Im/2.

It has been seen (in FIG. 3) that if the memory cell 15 is a read-only memory cell, the current which it is capable of putting through may be IM or Im depending on whether it is respectively not programmed or programmed. It is therefore important to compare the current put through by this cell 15 with IM/2. This new reference dimension is given by another cascade of the same type as the preceding ones, comprising another transistor-based divider bridge with transistors 49–50, the transistor 50 having its gate controlled by an inverter 51 and conducting current to another standard cell 52. Another comparator 33 then receives, at its input 35, a signal corresponding to the current which flows into the memory cell to be read 15 and receives, at its reference input 37, a signal given by the mid-point 53 of the divider bridge with transistors 49–50. The value of the reference voltage is related to the concentrations of impurities implanted in the conduction channels of the read-only memory cells. The standard memory cell is, of course, a read-only memory cell (which is programmed or not programmed depending on the mode of comparison chosen).

To avoid making the standard memory cells 44 and 52 consume current unnecessarily, control transistors, 54 and 55 respectively, may be placed between them and their transistor based divider bridge. These control transistors, 54 and 55, would be controlled by a common read-validating signal S.

It may be useful to distribute the read-only memory cells among the random-access memory cells so as to complicate the task of any fraudulent person, and to force him to examine all the cells of the memory in case he should find an external observation means to reveal the state of implantation of the impurities in the conduction channels of the memory cells. The result of this is that a memory cell 15 may be, for example, a read-only memory cell, while a neighbouring cell 55 on the same bit line, is a random-access memory cell. Or else, to simplify the approach, on certain by lines, for example, the bit line 24, memory cells will be random-access memory cells or read-only memory cells depending on whether they belong to even-order word lines, the word line 26 for example, or odd-order word lines, the word line 56 for example. It is then possible to use the parity bit of the address-word of the memory cell to be read, to turn on, at choice, one of the two transistors 42 or 49 and two transistor-based divider bridges in cascade with the standard memory cells, 44 and 52 respectively. The standard memory cell which has its transistor thus activated then applies its reference potential to the corresponding comparator. This comparator may deliver the information read.

For this reason, the address 30 (in a simple example, the last bit of the address-word) is applied to the control gate of these transistors 42 and 49. So as to differentiate between them, one of the transistors will be a P channel transistor, while the other will be a N channel transistor. For example, for an odd order address, the programmable cell 15 is read. The parity bit is equal to 1 and the N channel transistor 42 is conductive while the P channel transistor 49 is off. The reverse occurs for the reading of the cell 55. Under these conditions, the two comparators 32 and 33 receive, at their inputs 34 and 35 respectively, the same signal corresponding to the information to be read, and only one of these comparators, depending on the nature of the memory cell to be read, gives the information read. These two comparators can be replaced by a single comparator. For example, at its reference input 36, through a connection 58, the comparator 32 may receive, both the reference potential prepared by the standard cell 44 and that prepared by the standard cell 52. Only that cell of these two cells which is validated enables a comparison. The mid-point of the transistor-based divider bridge of the non-validated cell remains, in fact, unconnected, because its transistor (42 to 49) is off.

The making of an integrated circuit prototype with a memory plane containing read-only memory cells and random-access memory cells is made easier. To begin with, a memory array is chosen, containing only random-access memory cells. In a standard way, it is possible to program therein, in a first stage, the area of the read-only memory cells (distributed in order to hamper fraudulent persons). Then, in a second stage, it is possible to program therein, in a standard way, all the applications for which the planned electronic integrated circuit is to be used. Then, the designed circuit is tested functionally. When the desired functional characteristics are obtained, a definition is made in the zones of the read-only memory, of the memory cells which have to be programmed and those which do not have to be programmed and of the corresponding photomasking operation which results therefrom. For example, for non-programmed cells having no impurities in the conduction channel of their floating gate transistor, a mask is defined, designed to implant impurities in all the conduction channels of the cells of the memory array (read-only or random-access cells) except in those which have precisely been excluded. The finalizing of the manufacturing process suffers no additional drawback since the photomasking operation is already mastered as an operation needed to implant impurities in the conduction channels of transistors of random-access memory cells themselves. It is observed that the operation for characterizing the circuits, given a constant overall memory area, can be pushed very far downline (performed late) in the manufacturing process.

What is claimed is:

1. A memory array of cells comprising floating gate transistor electrically programmable memory cells, and floating gate transistor read-only memory cells which cannot be written or erased; each floating gate transistor having a channel; the channel of the floating gate transistor of each read-only memory cell being selectively doped with impurities or not doped with impurities depending on whether a programmed state or an unprogrammed state is desired; means for reading the electrically programmable memory cells and the read-only memory cells with each cell being read producing a voltage corresponding to information stored therein, said means for reading comprising means for comparing the voltage of the cell being read with a first reference voltage if the cell being read is an electrically programmable cell, or with a second and different reference voltage if the cell being read is a read-only memory cell.

2. A memory array according to claim 1 wherein the memory array further comprises at least one bit line connected to both read only memory cells and electrically programmable memory cells.

3. A memory array according to claim 1 or 2 wherein the memory array further comprises at least one bit line connected only to read-only memory cells and at least another bit line connected to only electrically programmable memory cells.

* * * * *